(12) United States Patent
Happoya et al.

(10) Patent No.: US 9,345,134 B2
(45) Date of Patent: May 17, 2016

(54) PRINTED WIRING BOARD

(71) Applicant: KABUSHIKI KAISHA TOSHIBA, Tokyo (JP)

(72) Inventors: Akihiko Happoya, Oume Tokyo (JP); Daigo Suzuki, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 14/335,700

(22) Filed: Jul. 18, 2014

(65) Prior Publication Data

US 2015/0264806 A1    Sep. 17, 2015

(30) Foreign Application Priority Data

Mar. 14, 2014   (JP) .................. 2014-051670

(51) Int. Cl.
| | |
|---|---|
| *H05K 9/00* | (2006.01) |
| *H05K 1/02* | (2006.01) |
| *H05K 3/10* | (2006.01) |
| *H05K 3/38* | (2006.01) |

(52) U.S. Cl.
CPC .............. *H05K 1/0298* (2013.01); *H05K 1/028* (2013.01); *H05K 3/10* (2013.01); *H05K 3/38* (2013.01); *H05K 2201/09036* (2013.01); *H05K 2201/2009* (2013.01); *Y10T 29/49155* (2015.01)

(58) Field of Classification Search
CPC ....... H05K 1/0298; H05K 1/028; H05K 3/10; H05K 3/38; H05K 2201/09036; H05K 2201/2009; Y10T 29/49155
See application file for complete search history.

(56) References Cited

U.S. PATENT DOCUMENTS

| 7,186,924 B2* | 3/2007 | Geva ..................... H05K 1/0219 174/255 |
|---|---|---|
| 8,106,302 B2* | 1/2012 | Chen ..................... H05K 1/0256 174/252 |
| 2009/0294155 A1* | 12/2009 | Suzuki ................. H05K 1/0218 174/254 |
| 2010/0027225 A1* | 2/2010 | Yuda ....................... H05K 1/141 361/736 |

FOREIGN PATENT DOCUMENTS

JP        2012-054329 A        3/2012

* cited by examiner

*Primary Examiner* — Hoa C Nguyen
(74) *Attorney, Agent, or Firm* — Patterson & Sheridan, LLP (57) ABSTRACT

According to one embodiment, a printed wiring board includes a circuit board, a ground pattern provided on the circuit board, a wiring pattern provided on the circuit board, a conductive reinforcing plate covering the ground pattern and the wiring pattern and electrically connected with the ground pattern, and an insulating portion provided between the conductive reinforcing plate and the wiring pattern.

19 Claims, 6 Drawing Sheets

PRINTED WIRING BOARD

CROSS-REFERENCE TO RELATED APPLICATION

This application is based upon and claims the benefit of priority from Japanese Patent Application No. 2014-051670, filed Mar. 14, 2014; the entire contents of which are incorporated herein by reference.

FIELD

Embodiments described herein relate generally to a printed wiring board, such as a printed circuit board.

BACKGROUND

There is currently provided a printed wiring board equipped with a reinforcing plate.

DETAILED DESCRIPTION

According to one embodiment, a printed wiring board includes a circuit board, a ground pattern provided on the circuit board, a wiring pattern provided on the circuit board, a conductive reinforcing plate covering the ground pattern and the wiring pattern and electrically connected with the ground pattern, and an insulating portion provided between the conductive reinforcing plate and the wiring pattern.

Exemplary embodiments are hereinafter described with reference to the drawings.

In this specification, some elements are given a plurality of different expression examples. These expression examples are presented by way of example only, and the elements may be expressed in other manners. In addition, elements not given a plurality of different expressions may be expressed in other ways as well.

The respective figures are only schematic illustrations, and conditions such as relationships between thicknesses and planar dimensions, and ratios of the thicknesses of respective layers, may be different from an actual board constructed according to the embodiments. Furthermore, dimensional relationships and ratios of some parts included in one figure may be different from the corresponding relationships and ratios shown in other figures.

(First Embodiment)

Figure 1:
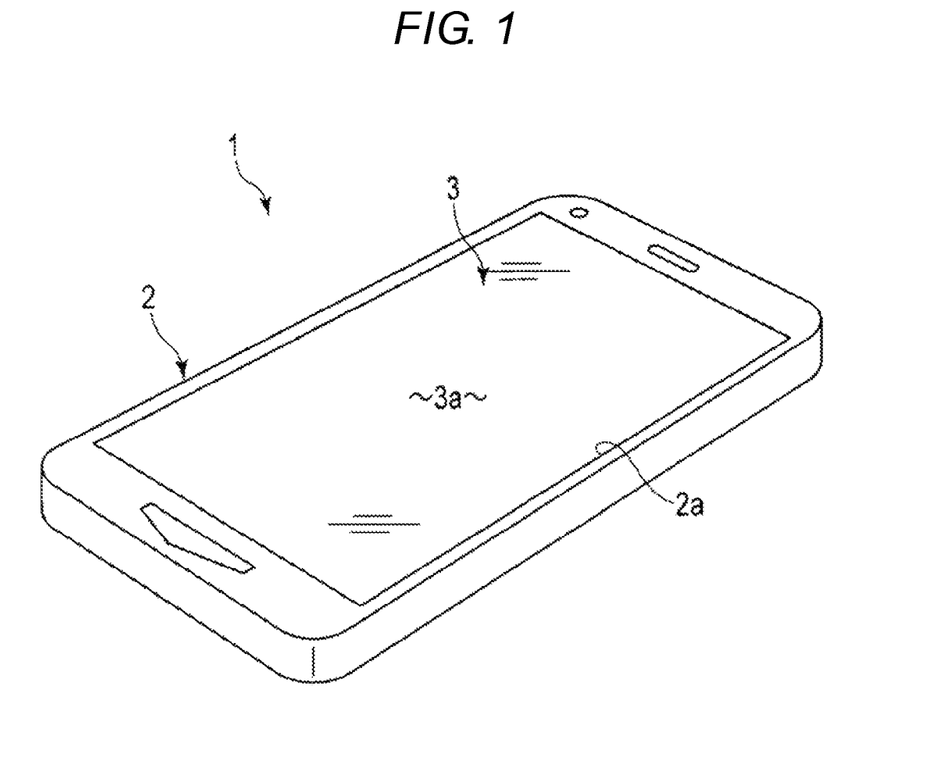
FIG. 1 is a perspective view illustrating an electronic device according to a first embodiment.

FIG. 1 illustrates an electronic device 1 according to a first embodiment. The electronic device 1 is a cellular phone (or smart phone), for example, but may be another type of device. The electronic device 1 is useful in a wide variety of electronic devices including portable computers, smart devices (such as tablet-type devices), image displays (such as television image receivers), and game consoles. The electronic device 1 is specifically also useful in the electronic devices which will be discussed in the second and the third embodiments herein.

As illustrated in FIG. 1, the electronic device 1 includes a housing 2 (case), and a display 3 and a module 34 (FIG. 2) each of which is housed in the housing 2. The housing 2 has an opening portion 2a through which a display screen 3a of the display 3 is exposed. The opening portion 2a is covered by a transparent protection panel (such as glass panel and plastic panel), for example.

Figure 2:
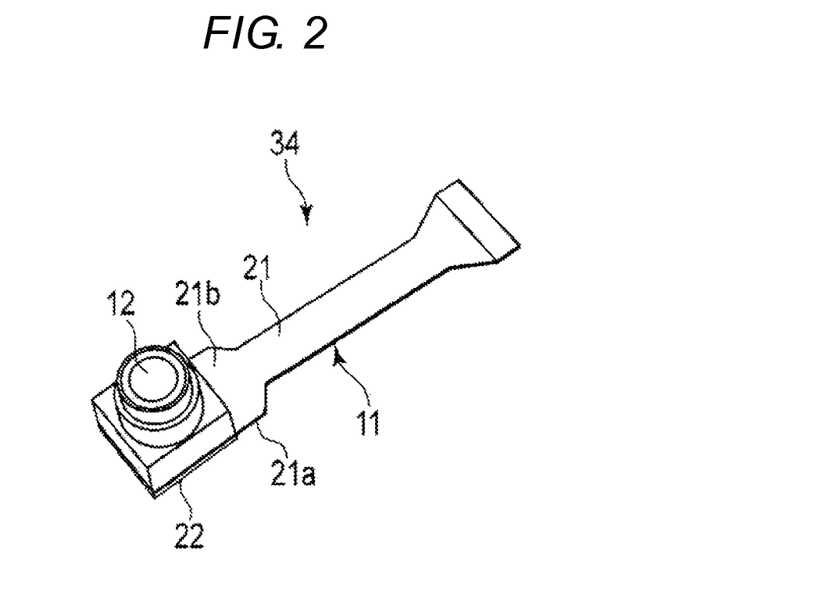
FIG. 2 is a perspective view illustrating a module according to the first embodiment.

FIG. 2 illustrates the module 34 according to this embodiment. The module 4 according to this embodiment is a camera module, for example. The module 34 is not limited to this example, but may be appropriately applied to various types of modules each including a printed wiring board, such as various types of connector modules.

As illustrated in FIG. 2, the module 34 includes a printed wiring board 11 and a camera 12. The camera 12 is an example of a functional part equipped on the module 34. The camera 12 is attached to an end of the printed wiring board 11, and is electrically interconnected with the printed wiring board 11.

Figure 3:
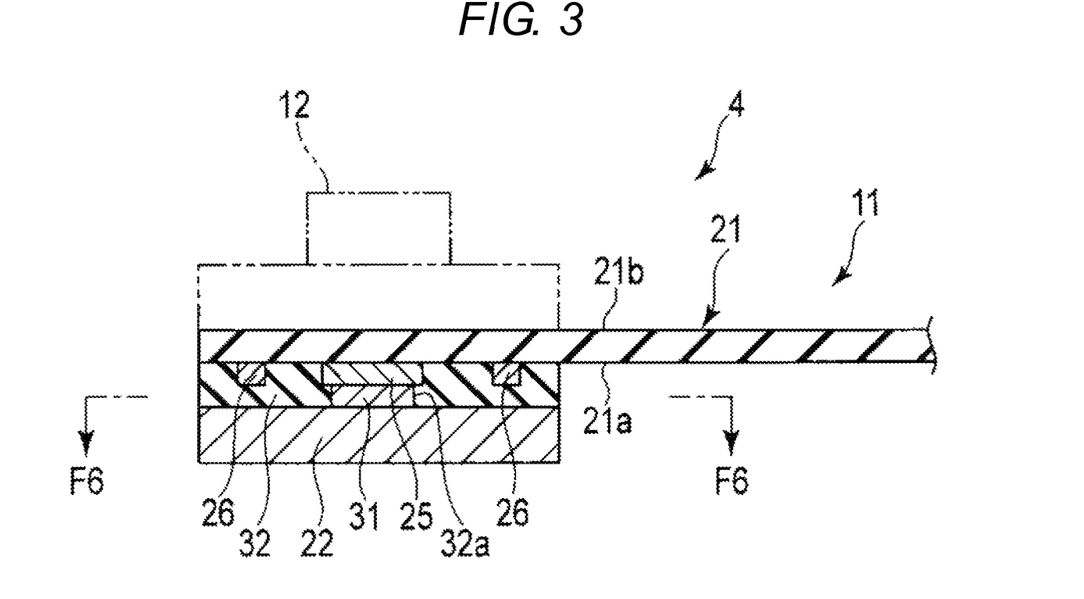
FIG. 3 is a cross-sectional view illustrating a printed wiring board according to the first embodiment.
Figure 4:
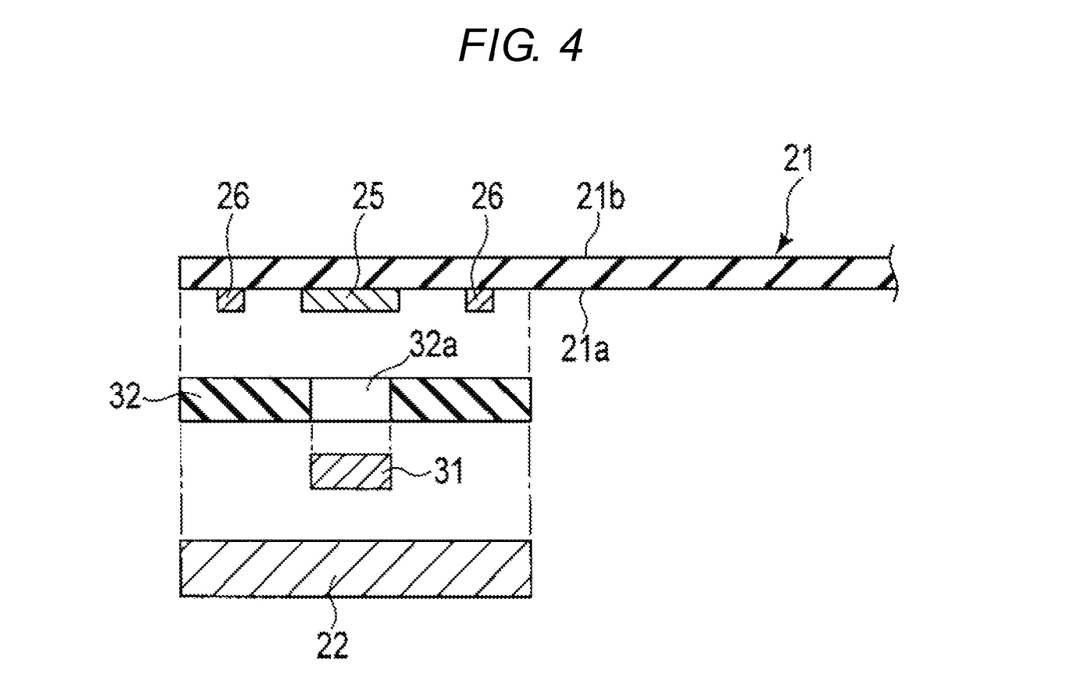
FIG. 4 is a cross-sectional view illustrating the printed wiring board according to the first embodiment.

FIGS. 3 and 4 illustrate the printed wiring board 11 according to this embodiment. The printed wiring board 11 is a flexible printed wiring board (FPC), for example, and has a flexible circuit board 21 (substrate), and a conductive reinforcing plate 22 attached to a part (such as an end) of the circuit board 21. The circuit board 21 is a four-layer circuit board or a two-layer circuit board, for example, and contains wiring patterns on the inner layers. The circuit board 21 has a first surface 21a, and a second surface 21b positioned on the side opposite to the first surface 21a. The camera 12 is attached to the second surface 21b of the flexible circuit board 21.

As illustrated in FIG. 4, an electrical ground pattern 25 and wiring patterns 26 (wiring) are provided on the first surface 21a (surface) of the circuit board 21. The wiring patterns 26 are wiring patterns through which signals pass (signal wiring). The wiring patterns 26 may be wiring patterns through which a power source is supplied to the camera 12 (power supply wiring).

Figure 5:
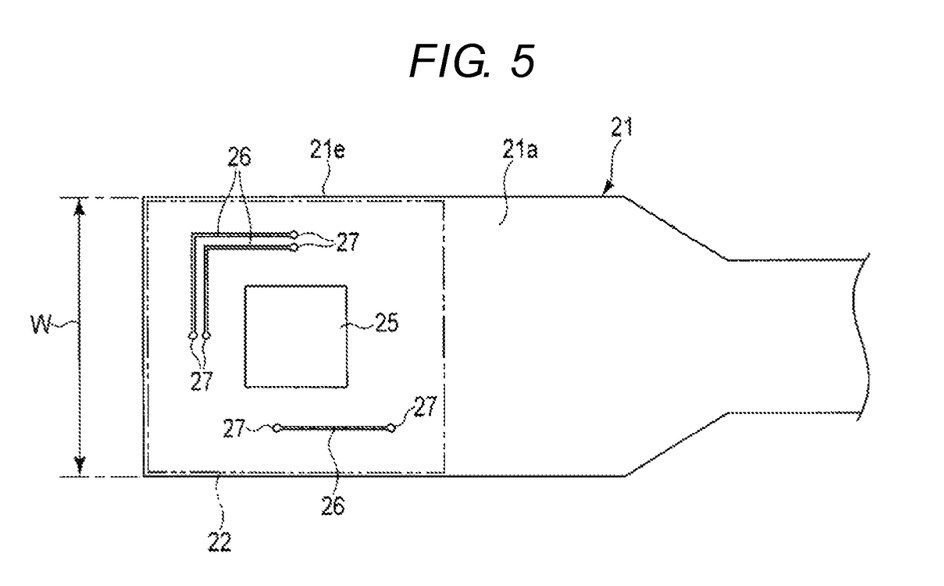
FIG. 5 is a plan view illustrating a circuit board according to the first embodiment.

FIG. 5 is a plan view illustrating the first surface 21a of the circuit board 21. The ground pattern 25 is a solid layer formed on the first surface 21a and having a predetermined area, and has a quadrangular shape such as rectangular, for example. The ground pattern 25 is provided on a part of the circuit board 21 generally centered thereon with respect to a width W of the circuit board 21. In other words, the ground pattern 25 is spaced away from the perimeter edge 21e of the circuit board 21. A plurality of the wiring patterns 26 and vias 27 are provided between the ground pattern 25 and the perimeter edge 21e of the circuit board 21 on three sides of the ground pattern 25 and not contacting either the ground pattern 25 or the perimeter edge 21e of the circuit board 21.

Referring again to FIG. 3, the reinforcing plate 22 is spaced from, and a surface thereof is in a facing relationship to with the first surface 21a of the circuit board 21. The reinforcing plate 22 is positioned on the rear side of the camera 12, i.e. facing the circuit board 21 on a side thereof opposed to the surface on which the camera 12 is mounted, for example. The reinforcing plate 22 thus provided improves the flatness and strength of the circuit board 21 in the area thereof where the camera 12 is attached thereto. Thus, the image quality of the camera 12 can be improved, and other properties of the camera 12 and the circuit board 21, such as shock resistance, are better.

As illustrated in FIGS. 3 and 5, the reinforcing plate 22 has a size sufficient for covering the ground pattern 25, the plural wiring patterns 26, and the vias 27 as one body. The reinforcing plate 22 has substantially the same width as the width W of the circuit board 21, for example. The reinforcing plate 22 is a metal plate, for example, such as a stainless steel material (SUS). The reinforcing plate 22 is not limited to a plate made of metal, but may be a component made of other materials as long as these materials are electrically conductive. For example, the reinforcing plate 22 may be a component made of a synthetic resin material having a conductive layer thereon formed by plating the layer, or the like, on the surface of the component.

As illustrated in FIGS. 3 and 4, a conductive adhesive portion 31 is provided between the reinforcing plate 22 and the ground pattern 25 according to this embodiment. The conductive adhesive portion 31 is a conductive adhesive sheet or a conductive adhesive agent, for example, and in one embodiment, contains solder material. The conductive adhesive portion 31 adhesively bonds the center of the reinforcing plate 22 and the ground pattern 25 together (i.e., it adhesively bonds the reinforcing plate 22 and the circuit board 21 together), while also electrically connecting together the reinforcing plate 22 and the ground pattern 25.

Accordingly, the potential of the reinforcing plate 22 becomes the ground potential, so that the reinforcing plate may function as a shield member for avoiding EMI (electromagnetic interference). The reinforcing plate 22 is thermally coupled with the circuit board 21 via the conductive adhesive portion 31 and the ground pattern 25. Thus, the metal reinforcing plate 22 also functions as a heat sink or transferring member for removing heat from the circuit board 21.

On the other hand, an insulating adhesive portion 32 (non-conductive adhesive portion) is provided between the reinforcing plate 22 and the wiring patterns 26. The insulating adhesive portion 32 is an insulating adhesive sheet or an insulating adhesive agent, for example, and in one embodiment, is made of resin. The insulating adhesive portion 32 adhesively bonds together the reinforcing plate 22 and the first surface 21a of the circuit board 21, and electrically isolates (insulates) the reinforcing plate 22 from the wiring patterns. This separation and insulation prevents short-circuiting between the wiring patterns 26 and the conductive reinforcing plate 22.

Figure 6:
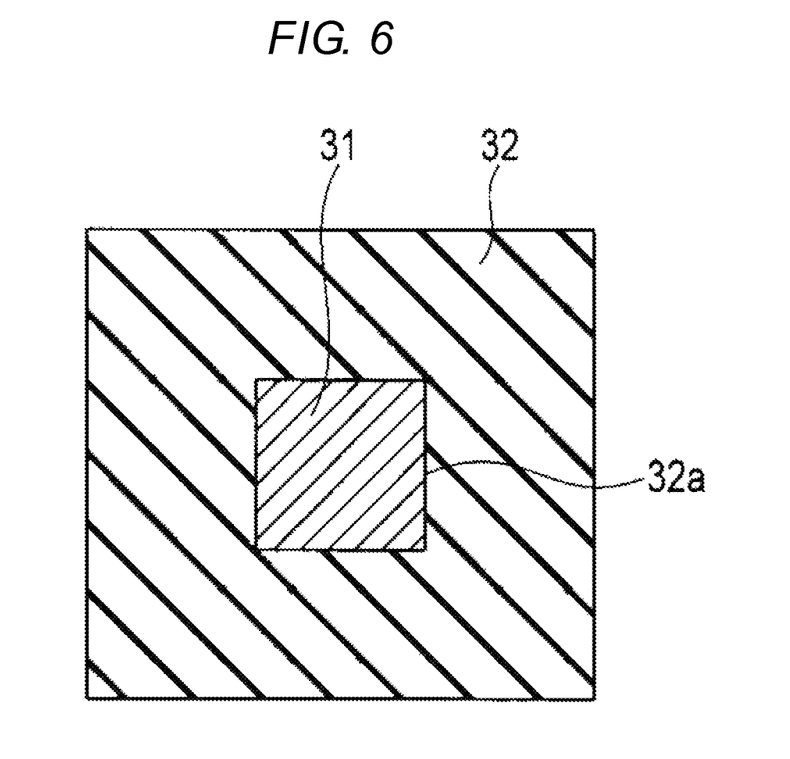
FIG. 6 is a cross-sectional view illustrating a conductive adhesive portion and an insulating adhesive portion illustrated in FIG. 3, taken along a line F6-F6.

FIG. 6 is a cross-sectional view of the conductive adhesive portion 31 and the insulating adhesive portion 32 as formed in FIG. 5. The insulating adhesive portion 32 has a frame shape surrounding the conductive adhesive portion 31 (i.e., frame shape surrounding the ground pattern 25), and has an opening portion 32a therein overlying the position of the ground pattern 25 on the circuit board 21. The conductive adhesive portion 31 is disposed within the perimeter of the frame-shaped insulating adhesive portion 32 (i.e., inside the opening portion 32a), and is exposed to the surrounding surface of the insulating adhesive portion 32.

An example of a manufacturing method of the printed wiring board 11 is now described.

As illustrated in FIG. 4, in the first place, the insulating adhesive portion 32 formed by an adhesive sheet, for example, is temporarily fixed, with pressure supplied thereto, to the first surface 21a of the circuit board 21. As a result, the wiring patterns 26 and the vias 27 extending through the circuit board are covered by the insulating adhesive portion 32 on first surface 21a. In the insulating adhesive portion 32, the opening portion 32a is formed in an area facing, and overlying, the ground pattern 25.

Then, the conductive adhesive portion 31, formed by a conductive adhesive agent, for example, is injected into the opening portion 32a of the insulating adhesive portion 32. As a result, the conductive adhesive portion 31 contacts the ground pattern 25, and electrically connects with the ground pattern 25. Subsequently, the insulating adhesive portion 32 and the conductive adhesive portion 31 are interposed between the circuit board 21 and the conductive reinforcing plate 22, and fixed therebetween with heat and pressure applied thereto, for example.

As a result, the conductive reinforcing plate 22 is adhesively bonded to the circuit board 21 via the conductive adhesive portion 31, and electrically connects with the ground pattern 25 via the conductive adhesive portion 31. Moreover, the conductive reinforcing plate 22 is adhesively bonded to the circuit board 21 via the insulating adhesive portion 32.

By these steps, the printed wiring board 11 provided with the conductive reinforcing plate 22 is produced. The insulating adhesive portion 32 and the conductive adhesive portion 31 are thermosetting or thermoplastic adhesive portions, for example, but may be other types of adhesive portions.

Rather than by adopting the foregoing manufacturing method, the insulating adhesive portion 32 may be produced by applying an insulating adhesive agent to the first surface 21a of the circuit board 21. In addition, the conductive adhesive portion 31 may be a conductive adhesive sheet fitted to the opening portion 32a of the insulating adhesive portion 32 beforehand. The printed wiring board 11 provided with the conductive reinforcing plate 22 is similarly produced even when these manufacturing methods are used.

The printed wiring board 11 thus constructed may improve the wiring efficiency of the board. More specifically, for attachment of a reinforcing plate to a printed circuit board, in general, a ground pattern having substantially the same area as that of the external appearance of the reinforcing plate is provided on the surface of a circuit board. In this case, a large area of the surface of the circuit board is occupied by the ground pattern, in which condition wiring patterns for signals and power supply are difficult to position in the occupied area. Accordingly, increases in the number of the layers of the printed wiring board, or enlargement of the size of the printed wiring board is then needed.

On the other hand, the printed wiring board 11 according to this embodiment includes the circuit board 21, the ground pattern 25 provided on the circuit board 21, the wiring patterns 26 provided on the circuit board 21, the conductive reinforcing plate 22, and the insulating portion (such as the insulating adhesive portion 32). The conductive reinforcing plate 22 covers the ground pattern 25 and the wiring patterns 26, and also electrically connects with the ground pattern 25. The insulating portion is disposed between the conductive reinforcing plate 22 and the wiring patterns 26. The insulating portion is not limited to the insulating adhesive portion 32, but may be an insulating portion which is not adhesive.

According to this structure, a part of the area of the surface of the circuit board 21 which would otherwise be covered by the conductive reinforcing plate 22 is utilized as an area occupied by the wiring patterns 26 and the vias 27. Accordingly, the wiring efficiency improves of the wiring board. Moreover, in addition to the improvement of the wiring efficiency, advantages such as reduction of the thickness of the printed wiring board 11 achieved by reducing the number of the layers of the circuit board 21, and miniaturization of the printed wiring board 11, are also provided.

According to this embodiment, the insulating portion provided between the conductive reinforcing plate 22 and the wiring patterns 26 corresponds to the insulating adhesive portion 32. The insulating adhesive portion 32 adhesively bonds the conductive reinforcing plate 22 and the circuit board 21. According to this structure, a relatively large adhesive force securely bonds the circuit board 21 and the conductive reinforcing plate 22 even when the wiring patterns 26 are formed in the area covered by the conductive reinforcing plate 22. Accordingly, the reliability of the printed wiring board 11 can be increased.

According to this embodiment, the insulating adhesive portion 32 has a frame shape surrounding the ground pattern 25. According to this structure, a relatively wide area of the circuit board 21 is allowed to be utilized for the area occupied by the wiring patterns 26. Moreover, a sufficiently large adhesive force securely bonds together the circuit board 21 and the conductive reinforcing plate 22. Accordingly, the wiring efficiency of the printed wiring board 11 further increases.

According to this embodiment, the conductive adhesive portion 31 is further provided between the conductive reinforcing plate 22 and the ground pattern 25. The conductive adhesive portion 31 adhesively bonds the conductive reinforcing plate 22 to the circuit board 21. According to this structure, the adhesive force bonding the circuit board 21 and the conductive reinforcing plate 22 further increases, so that the reliability of the printed wiring board 11 is improved.

According to this embodiment, the insulating adhesive portion 32 has the opening portion 32a having a frame shape and facing to the ground pattern 25. The conductive adhesive portion 31 is disposed inside the opening portion 32a of the insulating adhesive portion 32. According to this structure, the electric connection for ground is secured between the circuit board 21 and the conductive reinforcing plate 22 even when the insulating adhesive portion 32 is provided between the circuit board 21 and the conductive reinforcing plate 22.

The printed wiring boards 11 according to the second and third embodiments are hereinafter described. Configurations in the second and third embodiments having functionalities identical or similar functionalities of the corresponding configurations in the first embodiment are given identical reference numbers, and the same description about these configurations is not repeated. In addition, configurations in the second and third embodiments except for configurations discussed below are similar to the corresponding configurations in the first embodiment.

(Second Embodiment)

Figure 7:
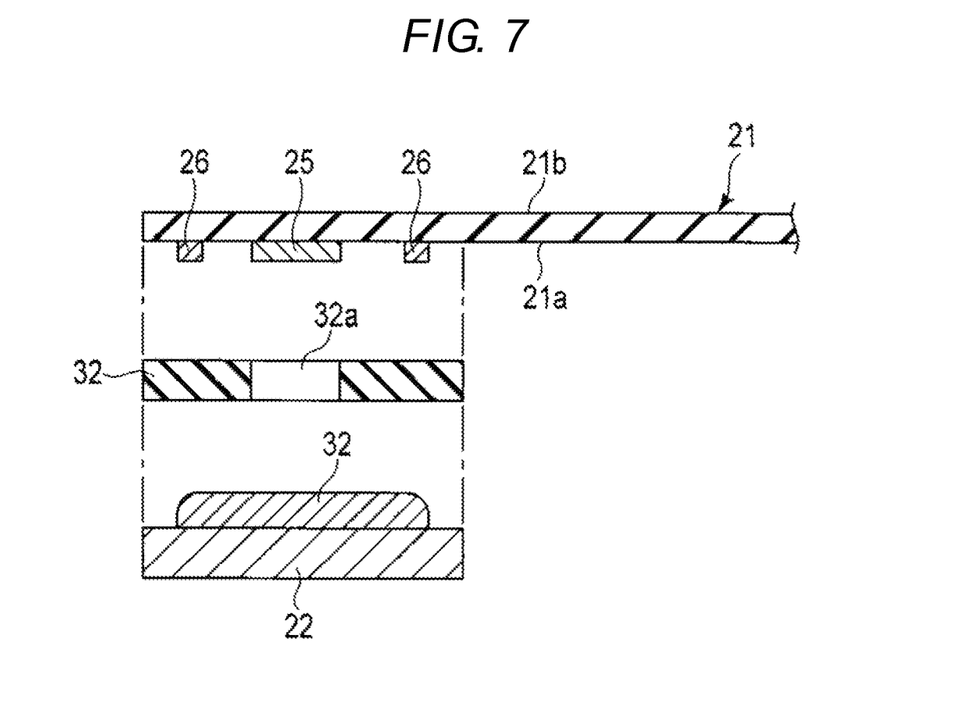
FIG. 7 is a cross-sectional view illustrating a printed wiring board according to a second embodiment.
Figure 8:
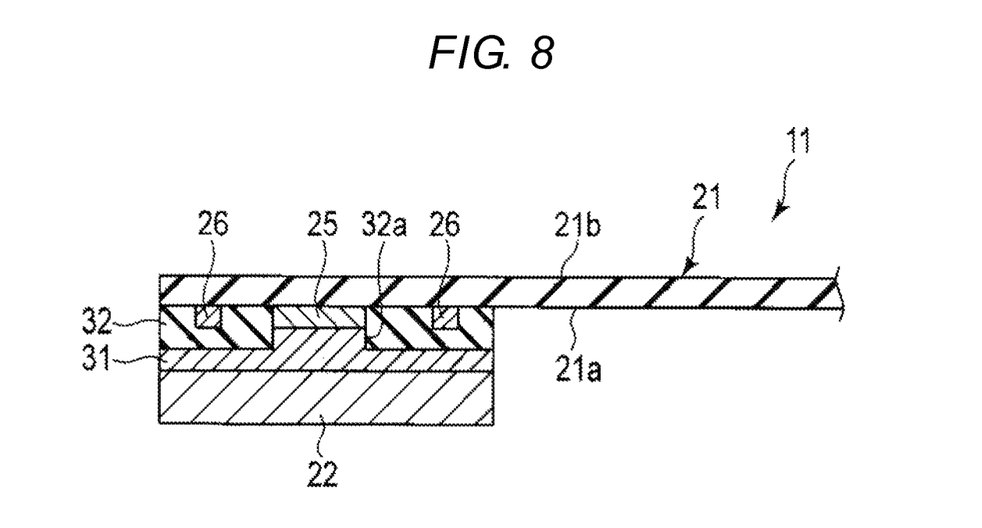
FIG. 8 is a cross-sectional view illustrating the printed wiring board according to the second embodiment.

FIGS. 7 and 8 illustrate the printed wiring board 11 according to the second embodiment. According to this embodiment, a part of the conductive adhesive portion 31 extends between the insulating adhesive portion 32 and the conductive reinforcing plate 22. In other words, at least a part of the insulating adhesive portion 32 is positioned between the circuit board 21 and the conductive adhesive portion 31.

According to an example of a manufacturing method of the printed wiring board 11 according to this embodiment, initially the insulating adhesive portion 32 formed by an adhesive sheet, for example, is temporarily fixed by pressing the adhesive sheet under pressure to the first surface 21a of the circuit board 21. Within the insulating adhesive portion 32, the opening portion 32a is formed in an area facing and overlying the ground pattern 25.

Separately from this temporary fixation, the conductive adhesive portion 31 formed by a conductive adhesive agent, for example, is applied to the surface of the conductive reinforcing plate 22. The conductive adhesive portion 31 is a thermosetting adhesive portion, for example, and has predetermined fluidity in this condition. Then, the insulating adhesive portion 32 and the conductive adhesive portion 31 are interposed between the circuit board 21 and the conductive reinforcing plate 22. In this process, a part of the conductive adhesive portion 31 is interposed between the insulating adhesive portion 32 and the conductive reinforcing plate 22 and pressed therebetween. As a result, the conductive adhesive portion 31 enters the interior of the opening portion 32a of the insulating adhesive portion 32, fills the opening portion 32a of the insulating adhesive portion 32, and contacts the ground pattern 25.

The insulating adhesive portion 32 and the conductive adhesive portion 31 interposed between the circuit board 21 and the conductive reinforcing plate 22 are both fixed therebetween with the application of heat and pressure, for example, whereby the conductive adhesive portion 31 hardens. By these steps, the printed wiring board 11 equipped with the conductive reinforcing plate 22 is produced.

According to the manufacturing method discussed herein, the conductive adhesive portion 31 may be applied to the surface of the insulating adhesive portion 32, rather than to the surface of the conductive reinforcing plate 22. Moreover, the insulating adhesive portion 32 may be placed on the conductive adhesive portion 31 applied to the conductive reinforcing plate 22, rather than temporarily fixed with pressure to the first surface 21a of the circuit board 21.

According to the printed wiring board 11 thus constructed, the wiring efficiency improves similarly to the first embodiment. Moreover, according to this embodiment, the connection between the conductive adhesive portion 31 and the ground pattern 25 is more easily established, as compared with the first embodiment, even when the accuracies of the position and the amount of the conductive adhesive portion 31 to be applied are lower. Accordingly, such advantages are produced as improvement of the manufacturing efficiency and manufacturing cost of the printed wiring board 11, and further increase in the reliability of the printed wiring board 11.

(Third Embodiment)

Figure 9:
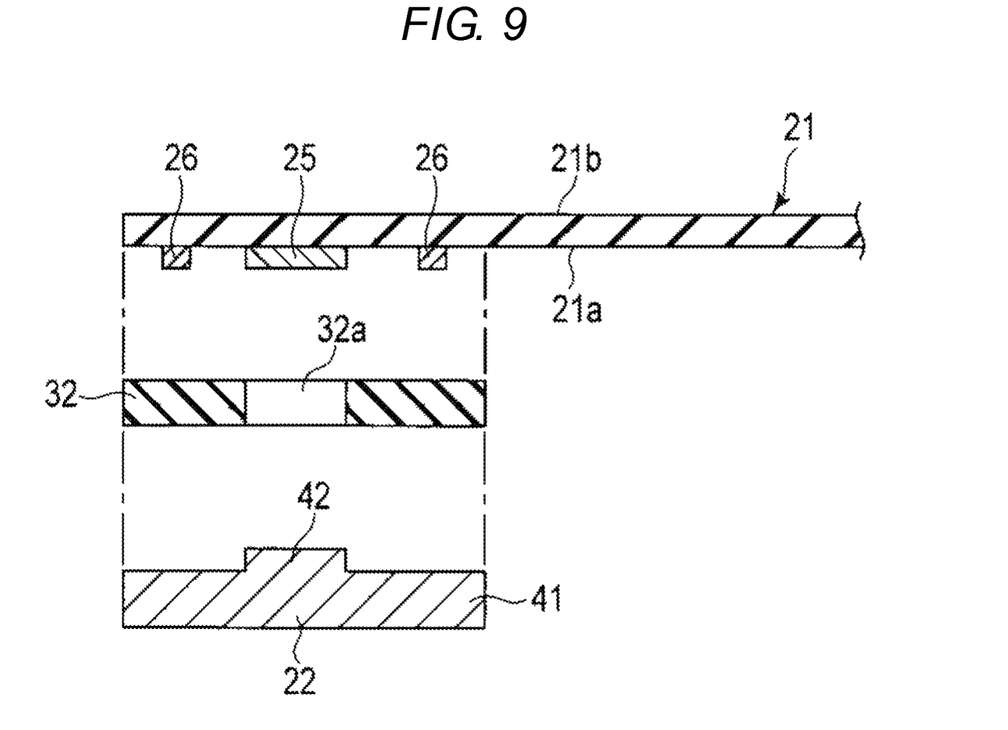
FIG. 9 is a cross-sectional view illustrating a printed wiring board according to a third embodiment.
Figure 10:
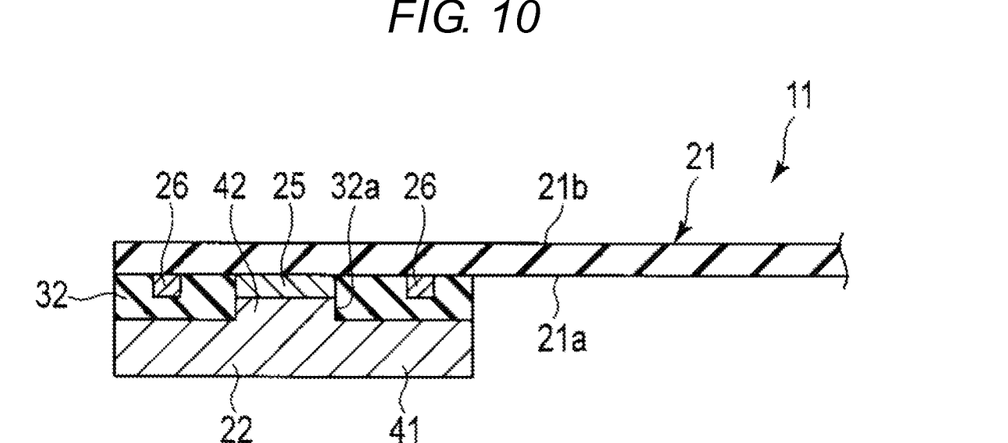
FIG. 10 is a cross-sectional view illustrating the printed wiring board according to the third embodiment.

FIGS. 9 and 10 illustrate the printed wiring board 11 according to the third embodiment. According to this embodiment, the conductive reinforcing plate 22 includes a main unit 41 portion (cover unit), and a convex portion 42. The main body unit 41 corresponds to the conductive reinforcing plate 22 in the first and second embodiments. The main body unit 41 has a size sufficient for covering the ground pattern 25, the plural wiring patterns 26, and the vias 27 as one body, and the convex portion faces the insulating adhesive portion 32. The convex portion 42 is also disposed at a position facing to the ground pattern 25, and projects toward the ground pattern 25 from the main body unit 41.

Figure 11:
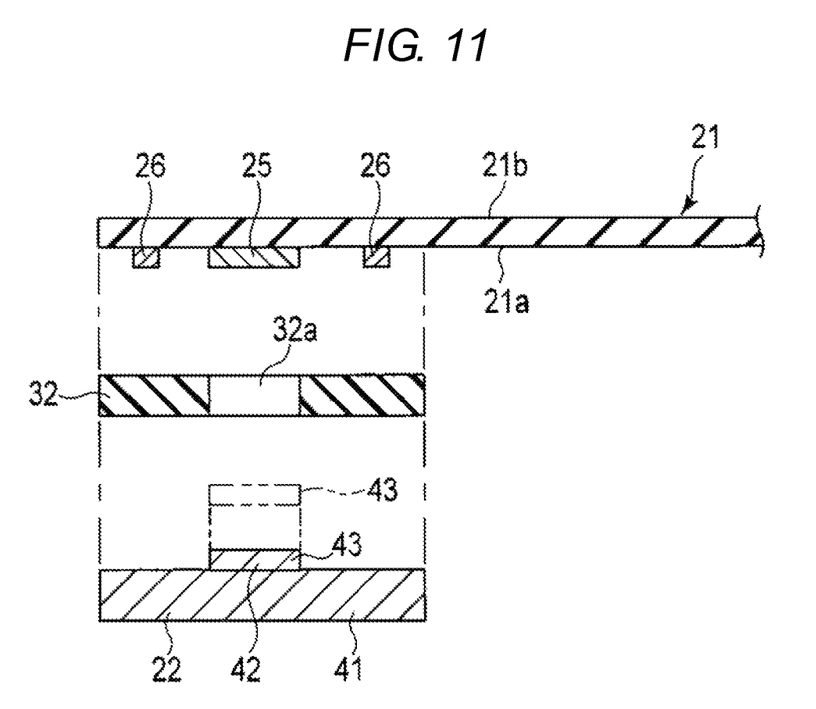
FIG. 11 is a cross-sectional view illustrating a printed wiring board according to a first modified example of the third embodiment.
Figure 12:
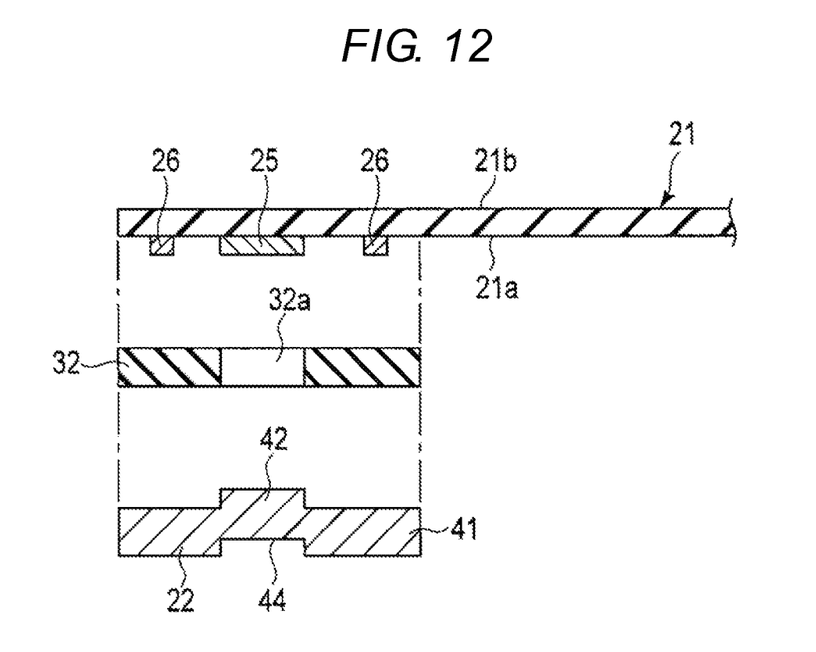
FIG. 12 is a cross-sectional view illustrating a printed wiring board according to a second modified example of the third embodiment.

According to this embodiment, the convex portion 42 is formed integrally with the main body unit 41 as one block. The convex portion 42 may be produced by attaching a member (such as plate member 43), which is a component separated from the main body unit 41, to the main body unit 41 as in a first modified example illustrated in FIG. 11. Alternatively, the convex portion 42 may be formed by drawing (stamping) a part of the main body unit 41 as in a second modified example illustrated in FIG. 12, or by machining a conductive plate. In this case, a concave portion 44 is formed in the rear surface of the convex portion 42 of the conductive reinforcing plate 22.

As illustrated in FIGS. 9 and 10, the insulating adhesive portion 32 has a frame shape surrounding the convex portion 42, and has the opening portion 32a facing and surrounding the ground pattern 25. The convex portion 42 is inserted through the inside of the frame-shaped insulating adhesive portion 32 (inside of the opening portion 32a), and comes into contact with the ground pattern 25 of the circuit board 21.

The insulating adhesive portion 32 is an adhesive portion which physically contracts thermosetting when heated, for example. According to this type of adhesive portion, a pulling force is produced between the circuit board 21 and the conductive reinforcing plate 22 after thermosetting of the insulating adhesive portion 32. As a result, the surface of the convex portion 42 is pressed against the ground pattern 25 by this pulling force. In other words, the insulating adhesive portion 32 contracts at the time of thermosetting, thereby producing a pulling force between the conductive reinforcing plate 22 and the circuit board 21 as a force for maintaining the contact between the convex portion 42 and the ground pattern 25. Accordingly, even when the convex portion 42 is not adhesive, the connection between the surface of the convex portion 42 and the ground pattern 25 may be maintained, and the convex portion 42 and the convex portion are biased against each other.

According to an example of a manufacturing method of the printed wiring board 11 according to this embodiment, in the first place, the insulating adhesive portion 32 formed by an adhesive sheet, for example, is temporarily fixed with pressure to the first surface 21a of the circuit board 21. The opening portion 32a of the insulating adhesive portion 32 is positioned in an area facing (and surrounding the ground pattern 25.

Then, the convex portion 42 of the conductive reinforcing plate 22 is inserted into the opening portion 32a of the insulating adhesive portion 32. Simultaneously, the insulating adhesive portion 32 is interposed between the circuit board 21 and the conductive reinforcing plate 22, and fixed therebetween with heat and pressure applied, for example. During these processes, the insulating adhesive portion 32 physically contracts as it thermosets, whereby a pulling force is produced between the circuit board 21 and the conductive reinforcing plate 22 and presses the surface of the convex portion 42 against the ground pattern 25. As a consequence, the convex portion 42 and the ground pattern 25 are electrically connected, in which condition the potential of the conductive reinforcing plate 22 becomes the ground potential. By these step, a printed wiring board 11 equipped with the conductive reinforcing plate 22 is produced.

According to the printed wiring board 11 thus constructed, the wiring efficiency improves similarly to the first embodiment. Moreover, according to this embodiment, the conductive adhesive portion 31 required in the structure of the first embodiment is not needed. In general, forming the conductive adhesive portion 31 is expensive and costly, so that elimination of the conductive adhesive portion 31 may reduce the manufacturing cost of the printed wiring board 11. Furthermore, according to this embodiment, the step for applying the conductive adhesive portion 31 is not required. Accordingly, the manufacturing efficiency further improves according to this embodiment, as compared with the first embodiment.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the printed wiring board 11 is not limited to the flexible printed wiring board, but may be a rigid circuit board. The ground pattern 25 is not limited to the type provided at the center of the circuit board 21 in the width direction thereof, but may be a type disposed adjacent to the edge of the circuit board 21, for example. The phrase "the conductive reinforcing plate 22 covers the wiring patterns 26" in this context refers to such a condition in which the conductive reinforcing plate 22 covers at least a part of the wiring patterns 26.

What is claimed is:

1. A printed wiring board, comprising:
a circuit board having a first surface;
a ground pattern provided on the first surface of the circuit board;
a wiring pattern provided on the first surface of the circuit board, through which a signal or power is to be supplied, the wiring pattern including a first pattern disposed between the ground pattern and a first edge of the circuit board, and a second pattern disposed separately from the first pattern and between the ground pattern and a second edge of the circuit board that is different from the first edge;
a conductive reinforcing plate covering the ground pattern and the wiring pattern, and electrically connected with the ground pattern; and
an insulating adhesive member provided between the conductive reinforcing plate and the wiring pattern, and adhesively bonding the circuit board and the conductive reinforcing plate.

2. The printed wiring board of claim 1, wherein the ground pattern is disposed at a center region of the insulating adhesive member on the first surface.

3. The printed wiring board of claim 2, further comprising:
a conductive adhesive member provided between the conductive reinforcing plate and the ground pattern at the center region of the insulating adhesive member, and the circuit board and the conductive reinforcing plate are further adhesively bonded together by the conductive adhesive member.

4. The printed wiring board of claim 3, wherein the insulating adhesive member has an opening, and
the conductive adhesive member is disposed inside the opening of the insulating adhesive member.

5. The printed wiring board of claim 4, wherein
a part of the conductive adhesive member extends between the insulating adhesive member and the conductive reinforcing plate.

6. The printed wiring board of claim 1, wherein
the conductive reinforcing plate has a convex portion which projects toward the ground pattern.

7. The printed wiring board of claim 6, wherein
the insulating adhesive member has an opening, and
the convex portion is received in the opening of the insulating adhesive member.

8. The printed wiring board of claim 6, wherein
the convex portion is in contact with the ground pattern.

9. The printed wiring board of claim 8, wherein
the insulating adhesive member provides an internal pulling force between the conductive reinforcing plate and the circuit board, so that contact between the convex portion and the ground pattern is maintained.

10. A printed wiring board, comprising:
a circuit board;
a ground pattern provided on the circuit board;
a wiring pattern provided on the circuit board;
a conductive reinforcing plate covering the ground pattern and the wiring pattern, and electrically connected with the ground pattern; and
an insulating member provided between the conductive reinforcing plate and the wiring pattern, wherein the ground pattern is disposed at a center region of the insulating member.

11. The printed wiring board of claim 10, wherein the insulating member surrounds the ground pattern.

12. The printed wiring board of claim 11, further comprising:
a conductive adhesive member provided between the conductive reinforcing plate and the ground pattern at the center region of the insulating adhesive member.

13. The printed wiring board of claim 11, wherein the conductive reinforcing plate includes a portion extending towards the ground pattern.

14. The printed wiring board of claim 10, wherein the insulating member provided between the conductive reinforcing plate and the wiring pattern provides a force to bias at least a portion of the conductive reinforcing plate to contact the wiring pattern.

15. A method of preparing a wiring board, comprising:
providing a printed circuit board having at least a ground layer and a wiring layer on the same surface of the printed circuit board, wherein the wiring layer includes a first layer located between the ground layer and a first edge of the printed circuit board, and a second layer located separately from the first layer and between the ground layer and a second edge of the printed circuit board that is different from the first edge;
providing an electrically insulating, adhesive layer so as to cover the ground layer;
positioning a conductive plate in an overlying juxtaposition to the electrically insulating, adhesive layer, such that the electrically insulating, adhesive layer is positioned between the printed circuit board and the conductive plate; and
pressing the conductive plate and the printed circuit board, in a direction toward each other.

16. The method of claim 15, further comprising:
positioning a conductive adhesive between the ground layer and the conductive plate before the pressing of the conductive plate and the printed circuit board toward each other.

17. The method of claim 16, wherein the conductive adhesive is positioned, such that the electrically insulating, adhesive layer surrounds the conductive adhesive.

18. The method of claim 16, wherein the electrically insulating, adhesive layer includes an opening through which the ground layer is exposed, and a portion of the conductive plate extends through the opening and contacts the ground layer, when the conductive plate and the printed circuit board are pressed.

19. The method of claim 15, wherein the printed circuit board is flexible and the conductive plate is rigid.

* * * * *